(12) United States Patent
Takano

(10) Patent No.: US 6,696,643 B2
(45) Date of Patent: Feb. 24, 2004

(54) ELECTRONIC APPARATUS

(75) Inventor: Yorihira Takano, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/158,861

(22) Filed: Jun. 3, 2002

(65) Prior Publication Data

US 2002/0162678 A1 Nov. 7, 2002

Related U.S. Application Data

(63) Continuation-in-part of application No. 09/778,952, filed on Feb. 8, 2001, now abandoned.

(30) Foreign Application Priority Data

Aug. 1, 2000 (JP) .......................... 2000-232859
Jul. 26, 2001 (JP) .......................... 2001-225832

(51) Int. Cl.⁷ ............................................. H02G 3/08
(52) U.S. Cl. ........................ 174/52.1; 361/719; 361/720; 257/712
(58) Field of Search ............................... 174/52.1, 52.4, 174/16.3; 361/718, 719, 720; 257/712

(56) References Cited

U.S. PATENT DOCUMENTS 5,661,902 A * 9/1997 Katchmar .................. 29/840
5,923,084 A   7/1999 Inoue et al.
6,101,092 A   8/2000 Onishi

FOREIGN PATENT DOCUMENTS

| JP | 58-175643 | 11/1983 |
|----|-----------|---------|
| JP | 2-118969 | 9/1990 |
| JP | 3-30456 | 2/1991 |
| JP | 3-296292 | 12/1991 |
| JP | 4-51597 | 2/1992 |
| JP | 5-160527 | 6/1993 |
| JP | 6-125156 | 5/1994 |
| JP | 6-196838 | 7/1994 |
| JP | 7-111378 | 4/1995 |
| JP | 7-115281 | 5/1995 |
| JP | 7-297582 | 10/1995 |
| JP | 8-204070 | 8/1996 |
| JP | 8-250822 | 9/1996 |
| JP | 10-190263 | 7/1998 |
| JP | 10-335866 | 12/1998 |
| JP | 11-40742 | 2/1999 |
| JP | 11-40901 | 2/1999 |
| KR | 1998-023339 | 7/1998 |

* cited by examiner

*Primary Examiner*—Hung V. Ngo
(74) *Attorney, Agent, or Firm*—Burns, Doane, Swecker & Mathis, LLP

(57) ABSTRACT

An electronic apparatus, which is inexpensive, has high packaging density, and has superior heat dissipating characteristics and reliability is provided. The electronic apparatus is provided with an electronic circuit substrate in which a heat generating first electronic component is mounted on its surface, and a case for housing the electronic circuit substrate. The electronic circuit substrate has a plurality of through holes formed directly under the first electronic component and thermally connected to the first electronic component. The electronic circuit substrate also contains a grounding pattern that is thermally connected to the through holes. The case has a protruding portion which contacts a rear surface portion of the electronic circuit substrate directly under the first electronic component, and which is thermally connected to the through holes.

8 Claims, 9 Drawing Sheets

ELECTRONIC APPARATUS

This application is a continuation-in-part of application Ser. No. 09/778,952, filed Feb. 8, 2001 abandoned.

BACKGROUND OF THE INVENTION

1. Field of the Invention

The present invention relates to an electronic apparatus provided with a case for housing an electronic circuit substrate on which heat generating electronic components are mounted, for example.

2. Description of the Related Art

Along with the development of techniques of miniaturization and large-scale integration of electronic components, the miniaturization of electronic apparatuses provided with electronic circuit substrates, typically optical transceivers, has developed rapidly recently. Problems with increased heat generation density due to the miniaturization of the electronic apparatuses provided with electronic circuit substrates has begun to be recognized. In addition, the heat distribution within an electronic apparatus provided with an electronic circuit substrate has a tendency to concentrate in specific locations due to the high integration of electronic components, and this trend can be predicted to become increasingly strong. In view of the further increase in the heat generation density and the concentration of the heat generation distribution in the future, there is a demand for the development of an electronic apparatus provided with an electronic circuit substrate and having superior heat dissipating characteristics.

Conventionally, a ceramic substrate having superior heat conduction characteristics and superior electrical characteristics is generally used for as a substrate material, and the entire rear surface of the substrate is contacts a case by using an adhesive or the like, for cases of dissipating heat from an electronic apparatus provided with an electronic circuit substrate in which the amount of heat generated increases, and the heat generation distribution becomes concentrated, as stated above.

For example, a structure like that shown in FIG. 13 may be used as a conventional electronic apparatus provided with an electronic circuit substrate. Reference numeral 1 in FIG. 13 denotes a heat generating component such as a heat generating electronic component, for example a power transistor. Reference numeral 2 denotes an electronic circuit substrate structured by a ceramic substrate, and the heat generating component 1 is mounted on the front surface of the electronic circuit substrate 2. Reference numeral 3 denotes a case for housing and protecting the electronic circuit substrate 2, and the top of the case 3 is open in order to place the electronic circuit substrate 2 into, and take the electronic circuit substrate 2 out of, the case 3. Reference numeral 4 denotes an adhesive for fixing the electronic circuit substrate to the case 3, and reference numeral 5 denotes a cover that covers the open portion of the case 3.

With the aforementioned structure of this first conventional example of an electronic apparatus provided with an electronic circuit substrate, heat generated by the first heat generating component 1 diffuses over the entire electronic circuit substrate 2, composed of the ceramic substrate having superior thermal conductivity characteristics, and the diffused heat is transferred to the case 3 via the adhesive 4. Heat transmitted to the case 3 then is dissipated to the atmosphere as the case 3 fulfills a role as a heat radiator.

In this case, heat generated by the heat generating component diffuses over the entire substrate in accordance with using the ceramic substrate having superior thermal conduction characteristics as the electronic circuit substrate 2. The diffused heat is dissipated to the case 3, provided with a heat radiator effect, from the entire rear surface of the electronic circuit substrate 2 contacting the case 3. Heat is therefore dissipated with good efficiency.

FIG. 14 is a schematic structure diagram showing a second conventional example of an electronic apparatus provided with an electronic circuit substrate, disclosed in JP 8-204070 A. A through hole 23 is wired for sending signals from a semiconductor element 21 within an electronic circuit substrate 22 on which the semiconductor element 21 is mounted. A flexible thermal conductor 24 or an adhesive adheres to a surface that is different from the surface on which the specific semiconductor element 21 is mounted on the electronic circuit substrate 22. A protruding portion 25 of a metal frame wall 26 contacts the thermal conductor 24.

In this case, much of the heat from the semiconductor element 21 is diffused widely into the frame wall 26 through the protruding portion 25. A high heat dissipating ability can be obtained with respect to the semiconductor element 21 by utilizing the large surface of the frame wall as a dissipating surface.

Further, a structure is shown in a third conventional example disclosed in JP 11-40742 A in which a lower surface of a module case contacts a metal portion formed on a mother board, and heat from the metal portion is transferred to a ground or to an electric power source layer within the mother board. Heat is dissipated, and dissipation fins on the module of the electronic circuit package are unnecessary.

However, with the electronic apparatus provided with an electronic circuit substrate, the first conventional example structured as stated above, a ceramic substrate must be used as the material of the electronic circuit substrate 2, and mounting must be performed so that the entire rear surface of the electronic circuit substrate contacts the case 3. A problem therefore develops in which the packaging density drops. In other words, a ceramic material having superior thermal conductivity characteristics is generally used as the substrate material because of the necessity to dissipate heat, as stated above, for cases in which the heat generating component 1 is mounted to a miniaturized electronic apparatus provided with an electronic circuit substrate, and mounting is performed so that the entire rear surface of the electronic circuit substrate 2 contacts the case 3. Normally, therefore, electrical/electronic components are not mounted to the rear surface of the electronic circuit substrate 2. Note that, even for cases in which the packaging density is given great weight and electrical/electronic components are mounted on the rear surface of the electronic circuit substrate 2, the ceramic substrate is attached floating above the case 3, and therefore it can be considered that the strength of the ceramic cannot withstand factors in its usage environment, such as vibration and shocks. Cracks and the like will be develop. With conventional examples, mounting of electrical/electronic components is limited to only one surface of the electronic circuit substrate 2, and therefore a problem exists in that the component packaging density is halved.

Further, a high component cost ceramic material must be used as the electronic circuit substrate 2 material, and therefore a problem exists in that the manufactured product cost increases.

Much of the heat from the semiconductor element 21 diffuses widely in the frame wall 26, through the thermal conductor 24 and the protruding portion 25, with the electronic apparatus of the second conventional example, and the heat dissipation capabilities with respect to the semiconductor element 21 increase. However, of the heat generated by the semiconductor element 21, that which is dissipated by thermal conduction is limited to a route in which it is dissipated to the outside from the through holes 23, the thermal conductor 24, the protruding portion 25, and the frame wall 26. For example, if the semiconductor element 21 is small, then a problem exists in that a region for the through holes 23 cannot be made large, and the heat dissipating capability of the semiconductor element 21 cannot be expected to increase.

Furthermore, the protruding portion 25 is formed such that it protrudes at a right angle into the inside of a portion of the frame wall 26. The protruding portion 25 consists of a level portion 25*a* and a vertical portion 25*b*. Of the heat generated by the semiconductor element 21, heat dissipated by thermal conduction passes through the vertical portion 25*b*. However, a problem exists in that the cross sectional surface area of the vertical portion 25*b* for heat to pass through has a large thermal resistance.

Further, the dimensions of the level portion 25*a* of the protruding portion 25 are larger than the dimensions of the semiconductor element 21, and therefore a problem exists in that the surface area for mounting electronic components to the rear surface of the electronic circuit substrate 22 becomes small.

With the third conventional example of the electronic apparatus, heat dissipation due to thermal conductivity of the heat of the electronic circuit package module is limited to a route in which it is emitted to the outside form the through holes, the ground or the electric power source layer, and the mother board. Similar to the second conventional example, the through hole region cannot be make large, and therefore a problem exists in that an increase in the thermal dissipation of the module cannot be expected.

SUMMARY OF THE INVENTION

The present invention aims to solve the above problems with the conventional art and the object of the present invention is to provide an electronic apparatus provided with an electronic circuit substrate which is inexpensive with high packaging density and superior heat dissipating characteristics and reliability.

In order to achieve the above objects, according to one aspect of the present invention there is provided an electronic apparatus provided with an electronic circuit substrate comprising:

an electronic circuit substrate comprising a resin circuit board formed with a wiring a pattern and a grounding pattern in an internal layer thereof a plurality of through holes provided directly below a portion where a non-encapsulated heat generating component is mounted and connected with the grounding pattern, and a case for protectively housing the electronic circuit substrate provided with a heat dissipating protruding surface portion contacting an area where the through holes of a rear surface of the electronic circuit substrate are disposed, and being formed so as to ensure a space between the case and the rear surface of the electronic circuit substrate for enabling mounting of low heat generating electrical/electronic components.

According to another aspect of the present invention there is provided an electronic apparatus provided with an electronic circuit substrate comprising:

an electronic circuit substrate comprising a resin circuit board formed with a wiring pattern and a grounding pattern in an internal layer thereof, a plurality of through holes provided directly below a portion where a heat generating component is mounted and which are not connected to the grounding pattern, and opposing insulating grooves formed in a front and rear surface of the electronic circuit substrate so as to surround the heat generating component, and a case for protectively housing the electronic circuit substrate provided with a heat dissipating protruding surface portion contacting an area where the through holes of the rear surface of the electronic circuit substrate are disposed, and being formed so as to ensure a space between the case and the rear surface of the electronic circuit substrate for enabling mounting of low heat generating electrical/electronic components.

According to the present invention there is provided an electronic apparatus provided with an electronic circuit substrate wherein:

a filler of a material with high thermal conductivity is filled in the plurality of through holes, and a heat dissipating grease intervenes at a contact portion between an area where the through holes of the electronic circuit substrate rear surface are disposed and the heat dissipating protruding surface portion of the case.

Moreover, in the present invention the heat generating component is an electrical/electronic component which generates a large amount of heat, such as a power transistor and the like, and the low heat generating electrical/electronic components are electrical/electronic components in which the amount of generated heat is smaller than in the heat generating component.

According to yet another aspect of the present invention there is provided an electronic apparatus comprising:

an electronic circuit substrate having mounted on a surface thereof a first non-encapsulated heat generating electronic component and a case for housing the electronic circuit substrate; wherein the electronic circuit substrate has a plurality of through holes disposed directly below the first non-encapsulated heat generating electronic component, and thermally connected to said first non-encapsulated heat generating electronic component; the first electronic circuit substrate has a grounding pattern thermally connected to the through holes; and wherein the case has a protruding portion disposed in contact with a rear surface portion of the electronic circuit substrate directly below the first non-encapsulated heat generating electronic component and thermally connected to the through holes.

According to yet another aspect of the present invention there is provided an electronic apparatus comprising:

an electronic circuit substrate having mounted on a surface thereof a first heat generating electronic component; and a case for housing the electronic circuit substrate; wherein the electronic circuit substrate has a plurality of through holes disposed directly below the first heat generating electronic component, and thermally connected to the first heat generating electronic component; the electronic circuit substrate has a plurality of grounding patterns of mutually different shapes thermally connected to the through holes; and wherein the case has a protruding portion disposed in contact with a rear surface portion of the electronic circuit substrate directly below said first heat generating electronic component and thermally connected to the through holes.

According to yet another aspect of the present invention there is provided an electronic apparatus comprising:

an electronic circuit substrate having mounted on a surface thereof a first heat generating electronic component and a case for housing the electronic circuit substrate; wherein the electronic circuit substrate has a plurality of through holes disposed directly below the first heat generating electronic component, and thermally connected to the first heat generating electronic component; the electronic circuit substrate has a grounding pattern thermally connected to the through holes; the case has a protruding portion disposed in contact with a rear surface portion of said electronic circuit substrate directly below the first heat generating electronic component and thermally connected to the through holes; the protruding portion having a prismoid shape composed of a level portion and an inclined portion; the through holes having positioned within the horizontal projection of the level portion of the protruding portion; and the first electronic component being formed to extend beyond the level portion.

According to yet another aspect of the present invention there is provided an electronic apparatus comprising:

an electronic circuit substrate having mounted on a surface thereof a first heat generating electronic component, a second electronic component and a case for housing the electronic circuit substrate; wherein the case has a protruding portion disposed in contact with a rear surface portion of the electronic circuit substrate directly below the first heat generating electronic component and thermally connected to the electronic circuit substrate; the protruding portion having a prismoid shape composed of a level portion and an inclined portion; and the second electronic component being mounted on a rear surface of the electronic circuit substrate, opposite the inclined portion.

According to yet another aspect of the present invention there is provided an electronic apparatus comprising:

an electronic circuit substrate having mounted on a surface thereof a first heat generating electronic component and a case for housing the electronic circuit substrate; wherein the electronic circuit substrate has a plurality of through holes disposed directly below the first heat generating electronic component, and thermally connected to the first heat generating electronic component; the electronic circuit substrate has a grounding pattern thermally connected to the through holes; the case has a protruding portion disposed in contact with a rear surface portion of the electronic circuit substrate directly below said first heat generating electronic component and thermally connected to the through holes; and wherein a heat dissipating grease is disposed in a continuous manner between the first electronic components and the electronic circuit substrate, within the through holes, and between the electronic circuit substrate and the protruding portion.

The electronic apparatus of the present invention is provided with an electronic circuit substrate and a support member for supporting the electronic circuit substrate, and a pin having a step, formed between the electronic circuit substrate and the support member. The stepped pin has a small diameter portion that is inserted from a rear surface of the electronic circuit substrate into a front surface, through an insertion hole formed on the electronic circuit substrate, and a large diameter portion that contacts the rear surface of the electronic circuit substrate. The electronic circuit substrate is fixed to the small diameter portion of the stepped pin by using solder.

In the electronic apparatus of the present invention, the stepped pin may have a caulking fixture portion opposite the small diameter portion for fixing the stepped pin after inserted into the insertion hole of the support member.

With the electronic apparatus of the present invention, electronic components may be mounted on both sides of the electronic circuit substrate by forming a space between the electronic circuit substrate and the supporting member by the large diameter portion of the stepped pin.

The electronic apparatus of the present invention is provided with the electronic circuit substrate, the case for housing the electronic circuit substrate, and optical semiconductor components fixed to the case, and the electronic circuit substrate and the optical semiconductor components are electrically connected by a film substrate.

The electronic apparatus of the present invention is mounted with a heat generating electronic component, and has: an electronic circuit substrate having a plurality of through holes, directly beneath the heat generating electronic component, which are thermally connected to the heat generating electronic component; and a heat dissipating member which contacts a rear surface portion of the electronic circuit substrate directly below the heat generating electronic component and which is thermally connected to the through holes. The electronic circuit substrate has a groove or a slit formed between a signal pattern of the heat generating electronic component and the area where the plurality of through holes are formed.

DETAILED DESCRIPTION OF THE PREFERRED EMBODIMENTS

Embodiments of the present invention are explained below. Each embodiment is explained while using the same reference symbols for identical, or equivalent, portions and locations.

Embodiment 1

Figure 1:
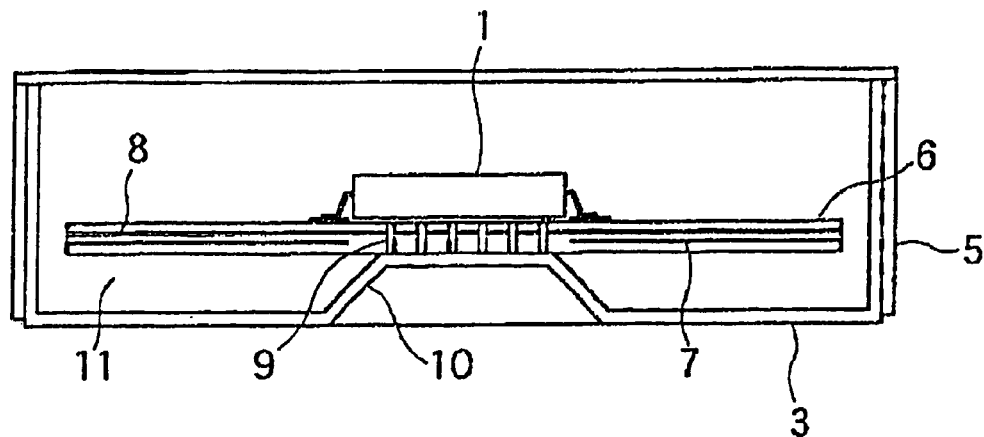
FIG. 1 is a schematic structural diagram of an electronic apparatus provided with an electronic circuit substrate according to Embodiment 1 of the present invention.
Figure 13:
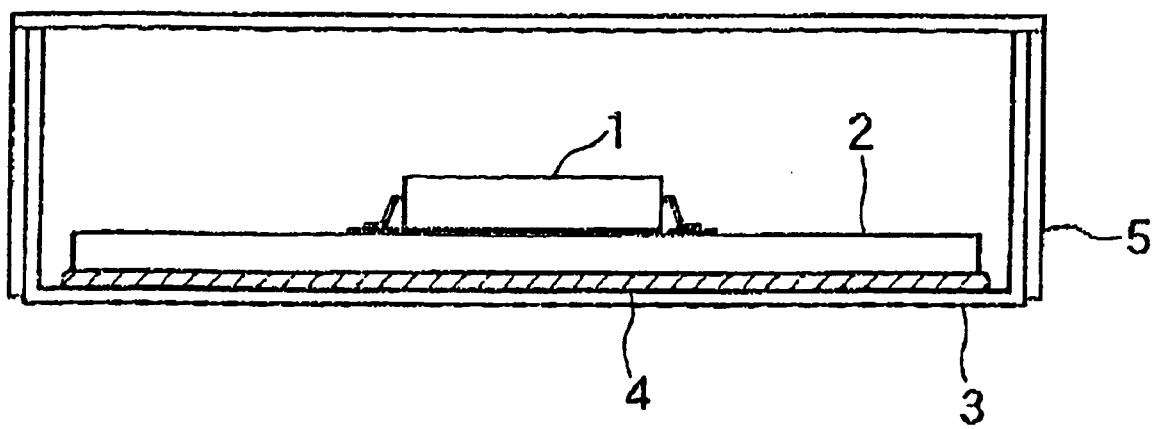
FIG. 13 is a schematic structural diagram showing an electronic apparatus provided with an electronic circuit substrate of a first conventional example.

FIG. 1 is a schematic structural diagram of an electronic apparatus provided with an electronic circuit substrate according to Embodiment 1. Identical reference symbols are attached to portions identical to those of the conventional example shown in FIG. 13, and therefore an explanation of those portions is omitted.

In FIG. 1, reference numeral 6 denotes an electronic circuit substrate composed of a circuit board made of resin. Reference numeral 7 denotes a wiring pattern formed in an internal layer of the electronic circuit substrate 6, and reference numeral 8 denotes a grounding pattern formed similarly in an internal layer of the electronic circuit substrate 6. Reference numeral 9 denotes a plurality of through holes formed directly beneath a mounting portion for a heat generating component 1, and the plurality of through holes are connected to the grounding pattern 8 within the electronic circuit substrate 6 by penetrating into the grounding pattern 8. Reference numeral 10 denotes a heat dissipating protruding surface portion, which is formed as a portion of a case 3 by protruding a portion therefrom. The electronic circuit substrate 6 is disposed such that positions of the through holes 9 of the rear surface thereof contact a top of the heat dissipating protruding surface portion 10. Reference numeral 11 denotes a space formed between the rear surface of the electronic circuit substrate 6 and the surface in the periphery of the heat dissipating protruding surface portion 10 of the case 3. Note that the space 11 is set to have a predetermind size that enables low heat generating electrical/electronic components to be mounted to the rear surface of the electronic circuit substrate 6.

In Embodiment 1, heat generated by the heat generating component 1 is therefore transferred to the entire case 3, via the heat dissipating protruding surface portion 10 that contacts the through holes 9 by way of the through holes 9 formed directly under the mounting portion of the heat generating component 1. The heat is dissipated to the atmosphere from the case 3 which has the combined effect of a heat radiator. Further, it becomes possible to diffuse the heat generated by the heat generating component 1 in the entire electronic circuit substrate 6 by connecting the through holes 9 with the grounding pattern 8 formed in the internal layer of the electronic circuit substrate 6.

Furthermore, heat dissipation from the heat generating component 1 can be performed by contacting only a portion of the rear surface of the electronic circuit substrate 6 with the case 3, and therefore low heat generating electrical/electronic components can also be mounted to the rear surface of the electronic circuit substrate 6. It thus becomes possible to increase the conventional component packaging density by approximately twofold. Further, it becomes possible to obtain heat dissipating effects equivalent to or greater than a conventional apparatus by using a circuit board made of resin such as inexpensive glass epoxy as the electronic circuit substrate 6 instead of an expensive ceramic substrate.

According to Embodiment 1, an electronic apparatus provided with an electronic circuit substrate, which has high packaging density, is inexpensive, and has superior heat dissipating characteristics can therefore be achieved.

Embodiment 2

Figure 2:
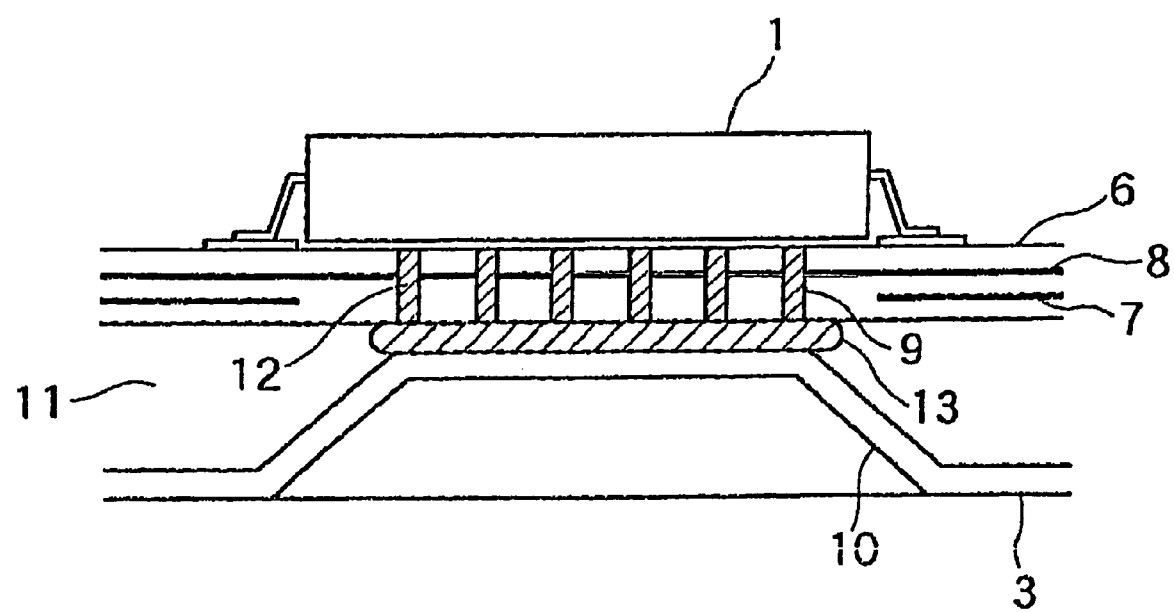
FIG. 2 is a schematic structural diagram of an electronic apparatus provided with an electronic circuit substrate according to Embodiment 2 of the present invention.

Embodiment 2 is explained next with reference to FIG. 2. FIG. 2 is a schematic structural diagram of an electronic apparatus provided with an electronic circuit substrate according to Embodiment 2, in which Embodiment 1 of the present invention is further improved over. Identical reference numerals are attached to portions identical to those in Embodiment 1, and therefore the repeat explanation thereof is omitted.

In FIG. 2, reference numeral 12 denotes a filler for filling the through holes 9, and the filler is made from a material having high thermal conductivity, such as copper. Reference numeral 13 denotes a heat dissipating grease applied to a contact surface between an area where the through holes 9 of the rear surface of the electronic circuit substrate 6 are disposed, and the heat dissipating protruding surface portion 10 of the case 3. The heat dissipating grease is made from a material having high thermal conductivity. Note that other structures are the same as in Embodiment 1.

In the above structured electronic apparatus provided with the electronic circuit substrate, it becomes possible to transfer a large amount of heat generated from the heat generating component 1 to the case 3 by means of the filler 12 that is filled in the through holes 9, and the heat dissipating grease 13 which intervenes at the contact portion between the area where the through holes 9 of the rear surface of the electronic circuit substrate 6 are arranged, and the heat dissipating protruding surface portion 10.

Therefore, not only are the same effects as in Embodiment 1 achieved, but an electronic apparatus provided with an electronic circuit substrate with even further improved heat dissipating characteristics can be realized in accordance with Embodiment 2.

Embodiment 3

Figure 3:
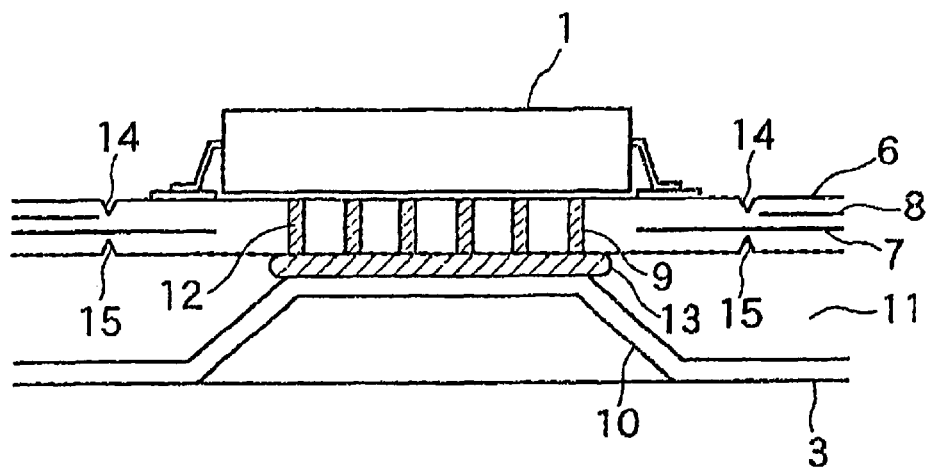
FIG. 3 is a schematic structural diagram of an electronic apparatus provided with an electronic circuit substrate according to Embodiment 3 of the present invention.
Figure 4:
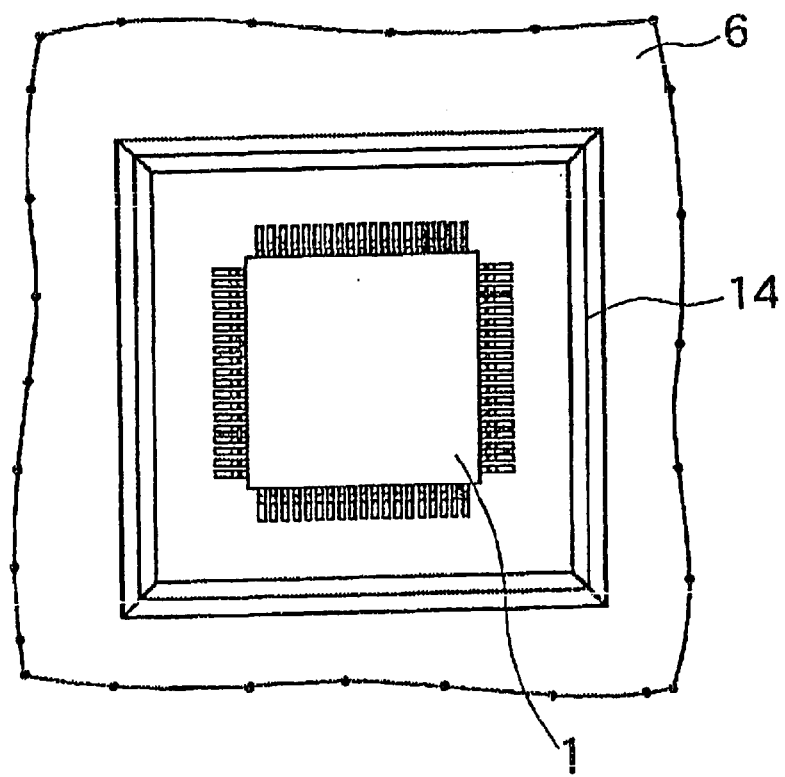
FIG. 4 is a plan view of the electronic circuit substrate described in FIG. 3.

Embodiment 3 is explained next with reference to FIGS. 3 and 4. FIG. 3 is a schematic structural diagram of an electronic apparatus provided with an electronic circuit substrate according to Embodiment 3, in which Embodiment 2 of the present invention is further improved upon. FIG. 4 is a partial plan view of the electronic circuit substrate in Embodiment 3. Identical reference numerals are attached to portions identical to those in Embodiment 2, and therefore the repeat explanation thereof is omitted.

The above mentioned improvements are explained first in detail. In Embodiment 2, as in the conventional example and in Embodiment 1, because the entire electronic circuit substrate 6 is warmed by the heat generated by the heat generating component 1 being diffused therein, there is a concern that heat stress will be imparted to other electronic components mounted on the electronic circuit substrate 6. In particular, this concern is expected to be large for cases where electronic components sensitive to temperature change are mounted in the periphery of the heat generating component. Embodiment 3 makes improvements upon such problems of Embodiment 2.

In FIGS. 3 and 4, reference numeral 14 denotes an insulating groove comprising a concave groove of a V-shaped cross section formed in the front surface of the electronic circuit substrate 6. The insulating groove is formed having a nearly square-shape so as to surround the periphery of the heat generating component 1 which has a nearly square, planar shape. Further, reference numeral 15 denotes an insulating groove comprising a concave groove of a V-shaped cross section, similar to the insulating groove 14, which is formed in the rear surface of the electronic circuit substrate 6. The insulating groove 15 is formed having a nearly square shape in a position corresponding to the insulating groove 14.

Further, the grounding pattern 8 is removed in the area where the through holes 9 are disposed so as not to be connected with the through holes 9. Note that other structures are the same as in Embodiment 2.

In the electronic apparatus provided with the electronic circuit substrate having the above structure, the through holes 9 are not connected with the grounding pattern 8, and the insulating grooves 14 and 15 are formed in corresponding positions on the front and rear surfaces of the electronic circuit substrate 6 so as to surround the heat generating component 1. Thus, the heat generated from the heat generating component 1 is not transferred to the grounding pattern 8 via the through holes 9. The heat transferred to the resin substrate is also blocked by the insulating groove 14 surrounding the heat generating component 1 and by the insulating groove 15 on the rear surface of the substrate. Therefore heat stress imparted from the heat generating component 1 to the electronic components in the periphery of the heat generating component 1 can be reduced while reliably performing heat dissipation from the heat generating component 1.

Therefore, not only are the same effects as in Embodiment 2 achieved, but constrains placed on mounting electrical/ electronic components in the periphery of the heat generating component 1 are relaxed. Thus, it becomes possible to achieve an electronic apparatus provided with an electronic circuit substrate that is smaller in size and more inexpensive.

A variant of Embodiment 3 is discussed next. Although Embodiment 3 is discussed above as an improvement on Embodiment 2, it can also be structured similar to the case of Embodiment 1 without the filler 12 filled in the through holes 9, which is made from a good thermal conductive material and without the heat dissipating grease which intervenes at the contact surface between the area where the through holes 9 of the rear surface of the electronic circuit substrate 6 are disposed and the heat dissipating protruding surface portion 10.

However, in this case, although the structure can be simplified by not applying the filler 12 and the heat dissipating grease, the heat dissipating characteristics cannot be prevented from dropping slightly.

Embodiment 4

Figure 5:
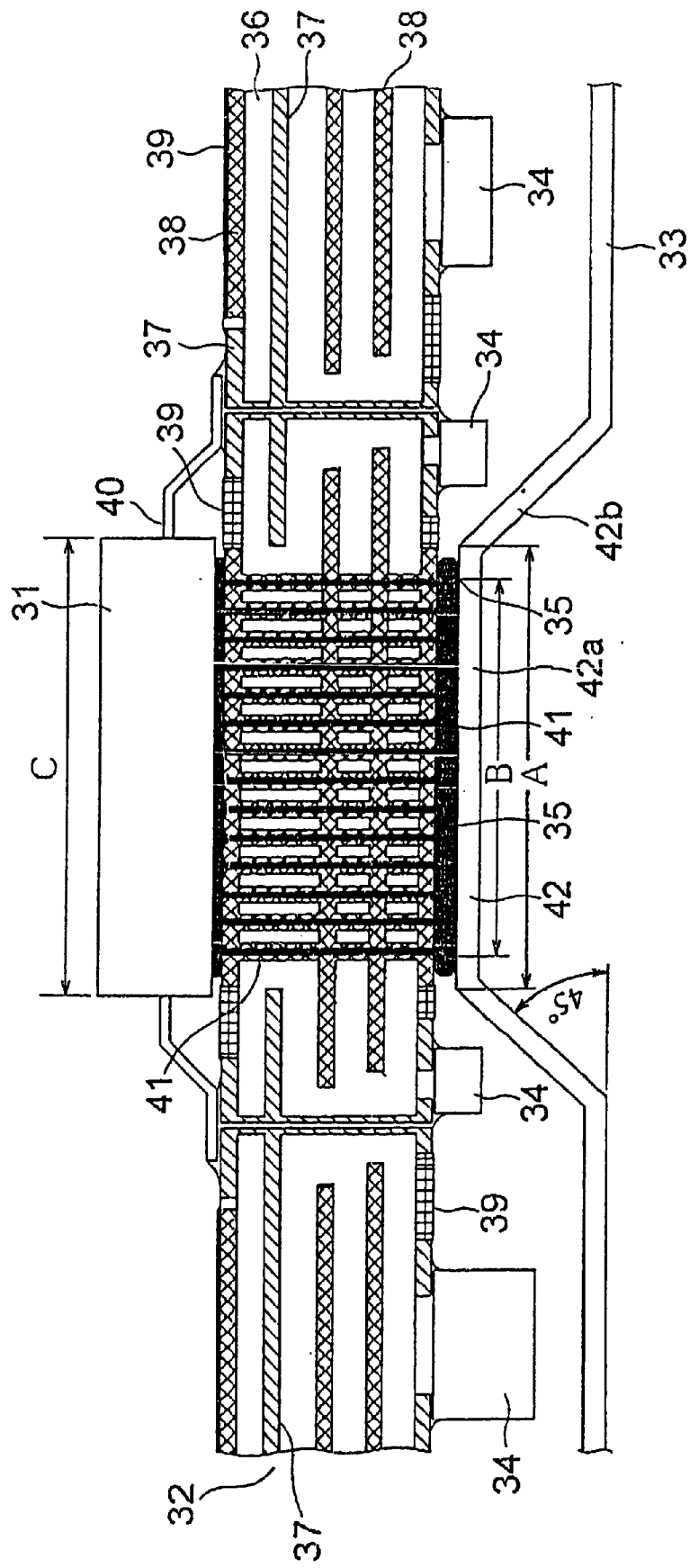
FIG. 5 is a cross sectional diagram of the main portion of an optical receiver of Embodiment 4 of the present invention.

FIG. 5 is a cross sectional diagram of the main portion of an optical receiver that is an electronic apparatus in Embodiment 4 of the present invention.

Figure 6:
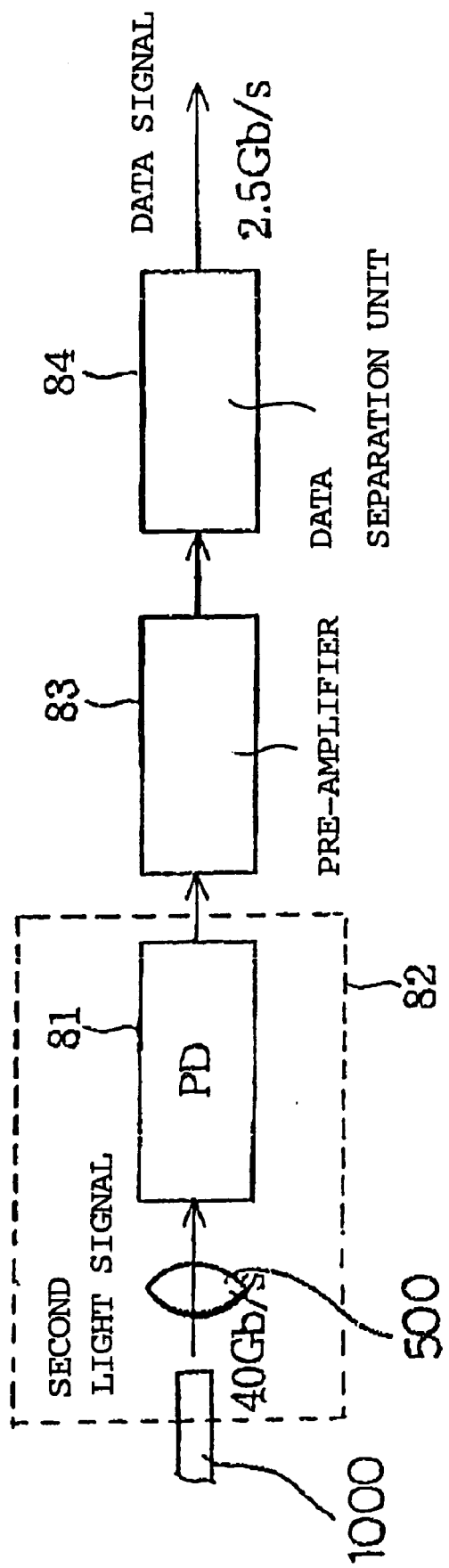
FIG. 6 is a block diagram of the optical receiver of FIG. 5.

First, the optical receiver will be briefly explained simply basing on a block diagram of FIG. 6. In the figure, reference numeral 81 denotes a photodiode (PD), an optical semiconductor component that converts received light into an electrical signal, and reference numeral 82 denotes an optical module that concentrates and receives a second optical signal, sent from a signal transmitting side through an optical fiber 1000 connected to the module, using a lens 500, and then converts the optical signal by the PD 81 to output the electrical signal. Reference numeral 83 denotes a pre-amp for amplifying the electrical signal containing high frequency signals output from the PD 81. Reference numeral 84 denotes a data separation unit, an optical semiconductor component that separates one electrical signal (for example, a 40 Gb/s signal) amplified by the pre-amp 83 and extracts a plurality of electrical signals (for example, 16 pieces of 2.5 Gb/s signals). The regenerated plurality of electrical signals are then transmitted to an external apparatus through signal lines.

The structure of the optical receiver that is the electronic apparatus is explained next. The optical receiver is provided with: an electronic circuit substrate 32; first heat generating electronic components 31, such as the data separation unit 84 and the pre-amp 83, mounted on a front surface of the electronic circuit substrate 32; a plurality of second electronic components 34 having a smaller amount of heat generation than the first electronic components 31 and mounted on a rear surface of the electronic circuit substrate 32; and a case 33 for housing the electronic circuit substrate 32, the first electronic components 31 and the second electronic components 34.

The electronic circuit substrate 32 is provided with: a substrate 36 comprised of a BT resin; a signal pattern 37 formed on the front and rear surfaces of, and in an internal portion of, the substrate 36; a grounding pattern 38 formed on the front surface and in the internal portion of the substrate 36; and solder resist 39 formed on the front and rear surfaces of the substrate 36, and on the surface of the grounding pattern 38. The substrate 32 also comprises a plurality of through holes 35 which penetrate the substrate 36 directly beneath the first electronic components 31 and which are connected to the grounding pattern 38 extending in a horizontal direction; a heat dissipating grease 41 made from silicone grease that fills the through holes 35 and intervenes between the electronic circuit substrate 32 and a protruding portion 42 of the case 33 that is discussed later; and a metal wiring 40, one end portion of which is connected to the first electronic components 31 and the other end portion of which is connected to the signal pattern 37. The plurality of grounding patterns 38 connected to the through holes 35 each have different shapes and diffuse heat from the first electronic components 31 over the entire electronic circuit substrate 32 so that the heat is emitted to the atmosphere. The heat generated from the first electronic components 31 therefore can be selectively diffused via the through holes 35 in the electronic circuit substrate 32, and the heat distribution within the electronic circuit substrate 32 can be controlled.

The case 33 made of aluminum is formed with the protruding portion 42 which contacts the rear surface portion of the electronic circuit substrate 32 directly below the first electronic components 31 through the heat dissipating grease 41 and which is thermally connected to the through holes 35. The protruding portion 42 is formed having a prismoid shape composed of a level portion 42a and an inclined portion 42b by pushing a portion of the case 33 to the inside. The angle that the inclined portion 42b makes with the horizontal is 45°. Note that, although the protruding portion 42 is formed simply by pushing a portion of the case 33 to the inside, it may also have a solid structure.

The through holes 35 are formed in the inside of the level portion 42a of the protruding portion 42, and the first electronic components 31 are formed extending to the outside of the level portion 42a. That is, a width dimension A of the level portion 42a, a width dimension B of the through holes, and a width dimension C of the first electronic components 31 have a relationship in which C>A>B.

The optical receiver is structured as stated above, and the grounding pattern 38 is connected to the through holes 35.

The heat generated from the first electronic components 31 is therefore also transferred via the through holes 35 to the grounding pattern 38 extending in the horizontal direction, and is diffused throughout the entire electronic circuit substrate 32. The heat dissipating efficiency of the first electronic components 31 is thus increased.

Further, the plurality of second electronic components 34 fixed to the rear surface of the electronic circuit substrate 32 are disposed in a space between the rear surface of the electronic circuit substrate 32 and the case 33 which develops due to the protruding portion 42 formed in a portion of the case 33, and the packaging density of the second electronic components 34 to the electronic circuit substrate 32 can thus be increased. Note that the second electronic components 34 have less heat value than the first electronic components 31, and that they may be merely attached to the rear surface of the electronic circuit substrate 32 without devising a special thermal dissipating means therefor.

Furthermore, the through holes 35 are formed directly under the first electronic components 31, and the level portion 42a of the protruding portion 42 opposes the through holes on the rear surface of the electronic circuit substrate 32, and therefore heat generated from the first electronic components 31 is transmitted to the protruding portion 42 via the through holes 35, and then emitted to the outside from the case 33, which is made of aluminum having high thermal conductivity and has a wide area contacting the atmosphere. Moreover, the high thermal conductivity heat dissipating grease 41 fills the internal portions of the through holes 35 and the space between the rear surface of the electronic circuit substrate 32 and the level portion 42a. Therefore the heat generated from the first electronic components 31 is transmitted very smoothly to the protruding portion 42, and the heat dissipating efficiency of the first electronic components 31 is increased. Note that a heat dissipating sheet having high thermal conductivity may also be disposed between the rear surface of the electronic circuit substrate 32 and the level portion 42a.

Figure 14:
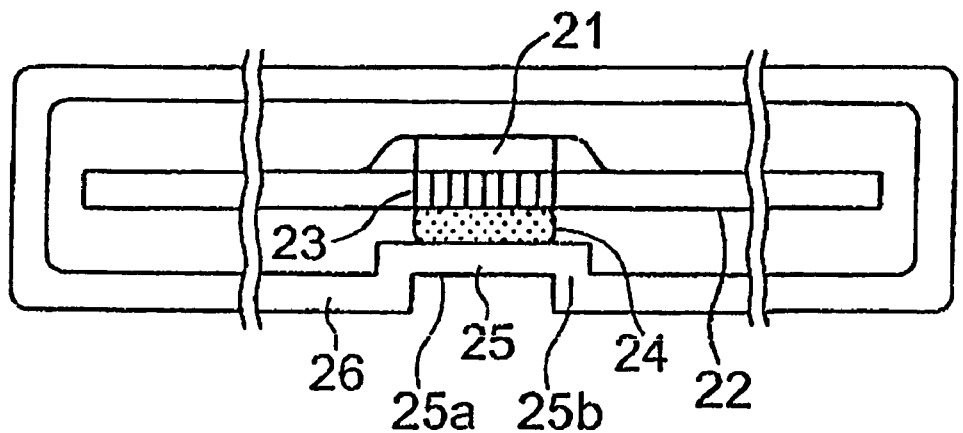
FIG. 14 is a schematic structural diagram showing an electronic apparatus provided with an electronic circuit substrate of a second conventional example.

Furthermore, the cross sectional area of a heat transmitting path from the first electronic components 31 of the inclined portion 42b of the protruding portion 42 in Embodiment 4 gradually increases in accordance with the amount it faces downward, its heat resistance becomes smaller, and thermal emission from the first electronic components 31 through the protruding portion 42 is increased in comparison to the case of the vertical portion 25b of the protruding portion 25 in which a portion of the metallic frame wall 26 of the first conventional example shown in FIG. 14 protrudes at a right angle. Moreover, the angle of inclination of the inclined portion 42b is 450°, and the space between the rear surface of the electronic circuit substrate 32 and the case 33 for disposing the second electronic components 34 can be secured.

Further, the width dimension A of the level portion 42a of the protruding portion 42 is larger than the width dimension B of the through holes 35. The portion of the heat generated by the first electronic components 31 which flows toward the level portion 42a is therefore transmitted reliably to the level portion 42a. In addition, the width dimension A of the level portion 42a is smaller than the width dimension C of the first electronic components 31, and therefore the surface area for mounting the second electronic components 34 on the rear surface of the electronic circuit substrate 32 does not become smaller than necessary.

Embodiment 5

Figure 7:
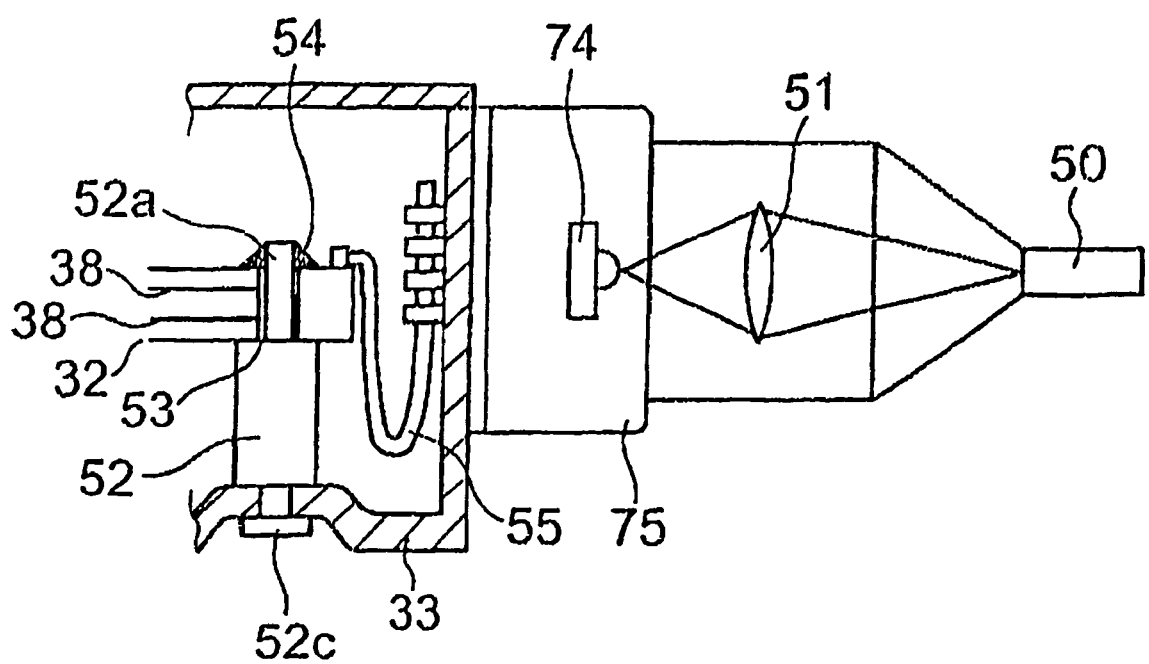
FIG. 7 is a cross sectional diagram of the main portion of an optical transmitter of Embodiment 5 of the present invention.

FIG. 7 is a cross sectional diagram of the main portion of an optical transmitter of Embodiment 5 of the present invention.

Figure 8:
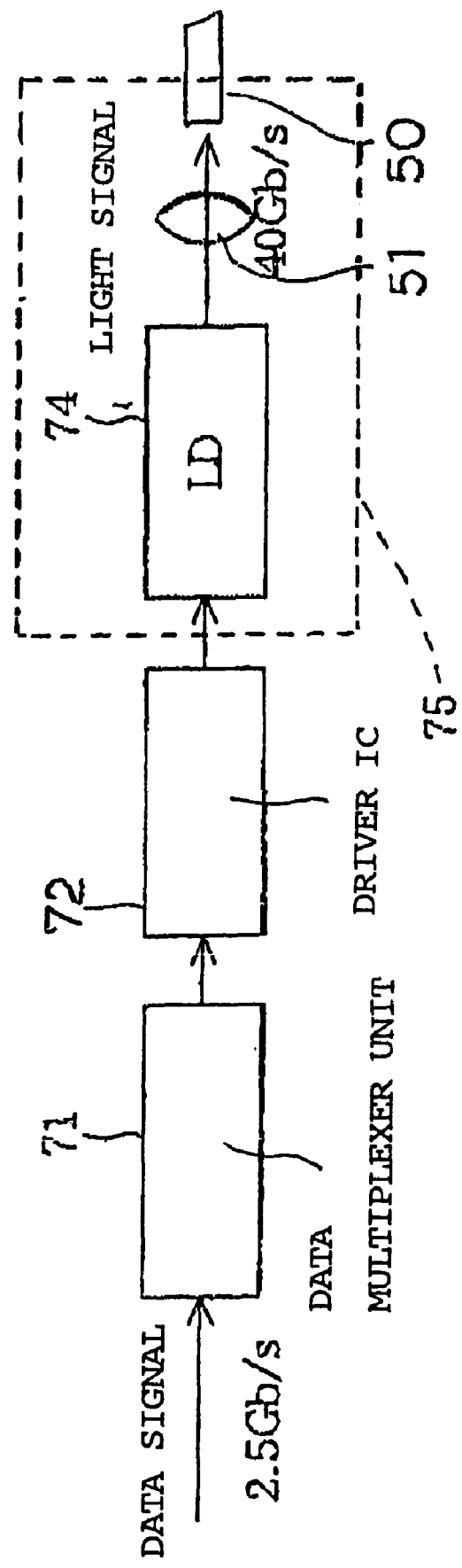
FIG. 8 is a block diagram of the optical transmitter of FIG. 7.

First, a simple explanation of the optical transmitter is given based on the block diagram of FIG. 8. In the figure, reference numeral 71 denotes a date multiplexer unit for multiplexing a plurality of electrical signals, for example 2.5 Gb/s (giga bits per second) signals, into one electrical signal of 40 Gb/s. Signals that are multiplexed in the data multiplexer unit 71 undergo level amplification by a driver IC 72, and a modulated signal (high frequency signals) for driving a laser diode (LD) 74 as an optical semiconductor component is generated. The modulated signal is converted into an optical signal of 40 Gb/s in the LD 74, and output. The output optical signal is transmitted to another optical receiver through a lens 51 and an optical fiber 50. Further, reference numeral 75 denotes an optical module within which the lens 51 and the LD 74 are mounted.

The structure of the optical transmitter as the electronic apparatus is explained next. Similar to the optical receiver discussed above, the optical transmitter is also provided with: the first heat generating electronic components 31 mounted on the front surface of the electronic circuit substrate 32 (note that the electronic components 31 are components such as the data multiplexer unit 71 and the driver IC 72 in Embodiment 5); the plurality of the second electronic components 34 having a smaller amount of heat generation than the first electronic components 31 and mounted on the rear surface of the electronic circuit substrate 32; and the case 33 for housing the electronic circuit substrate 32, the first electronic components 31 and the second electronic components 34.

The structure of the electronic circuit substrate 32 is similar to the structure of the optical transmitter of Embodiment 4. The heat dissipating grease 41 is filled into the plurality of through holes 35 that penetrate into the substrate 36 directly below the first electronic components 31, and are connected to the grounding pattern 38 which extends in the horizontal direction.

Further, the structure of the case 33 is also similar to that of the optical receiver of Embodiment 4. The prismoid shape protruding portion 42 is formed such that it contacts the portion of the rear surface of the electronic circuit substrate 32 directly below the first electronic components 31, through the heat dissipating grease 41, and is thermally connected to the through holes 35.

Further, the relationship between the width dimension A of the level portion 42a of the protruding portion 42, the width dimension B of the through holes, and width dimension C of the first electronic components 31 is also one in which C>A>B, so that a structure similar to that of the optical receiver of Embodiment 4 is obtained.

The electronic circuit substrate 32 is fixed to the case 33 by a fixing member 52 in the optical transmitter having the above structure. The electronic circuit substrate 32 has a through hole 53 used for the fixing member and thermally connected to the grounding pattern 38. The grounding pattern 38 is thermally connected to the case 33 through the fixing member 52.

Figure 9:
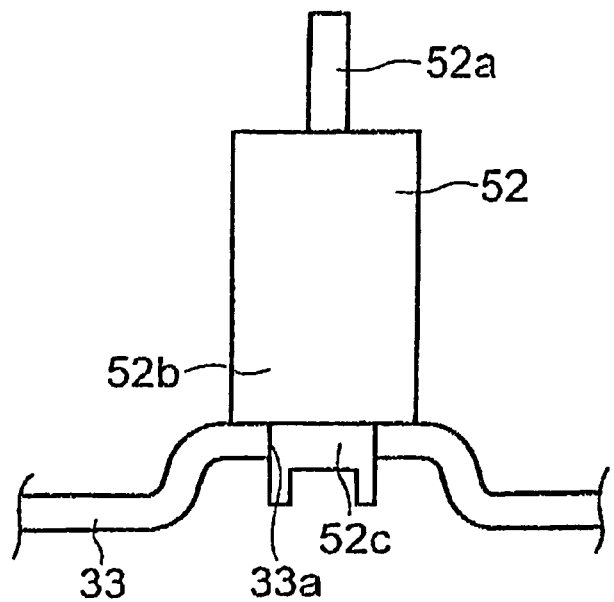
FIG. 9 is a diagram showing a caulking fixture portion of a fixing member of FIG. 7 when inserted into an insertion hole of a case.
Figure 10:
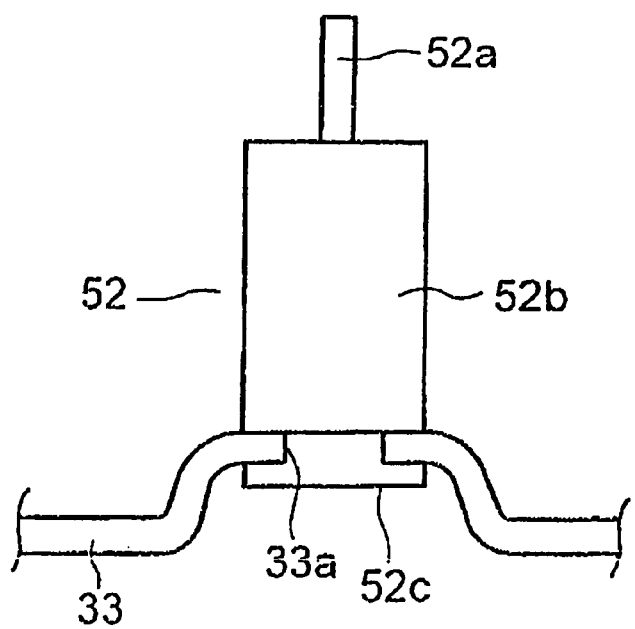
FIG. 10 is a diagram showing a caulking fixture portion of the fixing member of FIG. 7 when inserted into an insertion hole of a case and caulked.

As shown in FIG. 9 and FIG. 10, the fixing member 52 is a stepped pin having a small diameter portion 52a that is inserted from the rear surface of the electronic circuit substrate 32 into the front surface, through the through hole 53 used for the fixing member, and a large diameter portion 52b that contacts the rear surface of the electronic circuit substrate 32. The electronic circuit substrate 32 is fixed to the small diameter portion 52a by using solder.

Further, the case 33 has an insertion hole 33a into which the fixing member 52 is inserted. The fixing member 52 has a caulking fixture portion 52c on the side opposite to the small diameter portion 52a, which is inserted into the insertion hole 33a to be caulked and fixed.

The fixing member 52 as the stepped pin with the above-mentioned structure is fixed simply to the case 33 by caulking the caulking fixture portion 52c after inserting the caulking fixture portion 52c into the insertion hole 33a of the case 33. The small diameter portion 52a is then inserted into the through hole 53 used for the fixing member, and a head portion of the small diameter portion 52a is soldered by using solder 54, thus fixing the electronic circuit substrate 32 to the inside of the case 33.

Figure 11:
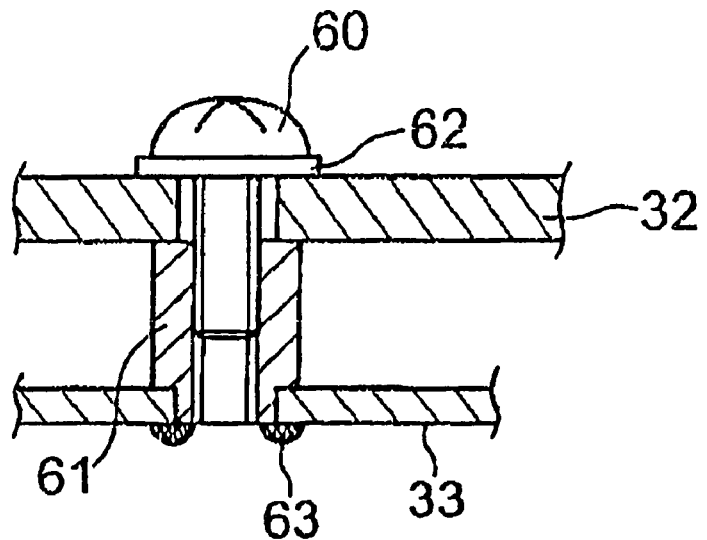
FIG. 11 is a diagram showing a fixing means for fixing an electronic circuit substrate to a conventional case.

With a conventional apparatus, the electronic circuit substrate 32 is fixed inside the case 33 by using a screw 60, a stud 61, a washer 62, and solder 63 as shown in FIG. 11, for example, and therefore the surface area occupied by the screw 60 on the front surface of the electronic circuit substrate 32 is large. In Embodiment 5, however, the surface area occupied on the surface of the electronic circuit substrate 32 by the solder 54 becomes smaller, and the mounting efficiency of the electronic circuit substrate 32 is accordingly increased.

Furthermore, the fixing members 52 fixed at the four corners of the case 33 are stepped pins, and therefore a space between the rear surface of the electronic circuit substrate 32 and the surface of the internal walls of the case 33 is reliably ensured by the fixing member 52 and the protruding portion 42.

Further, the electronic circuit substrate 32 formed within the case 33, and the optical module 75 fixed to the side surface of the case 33 are electrically connected by a film substrate 55 having flexibility in the optical transmitter having the above structure.

Even if shape changes, expansion, and contraction develop in the electronic circuit substrate 32, the optical module 75 and the like, the shape changes, contraction, and expansion are absorbed by the film substrate 55 with this structure, and the optical transmitter can be used over a long period of time.

Note that the substrate for fixing the optical module and the electronic circuit substrate 32 may also be electrically connected using a film substrate having flexibility.

Embodiment 6

Figure 12:
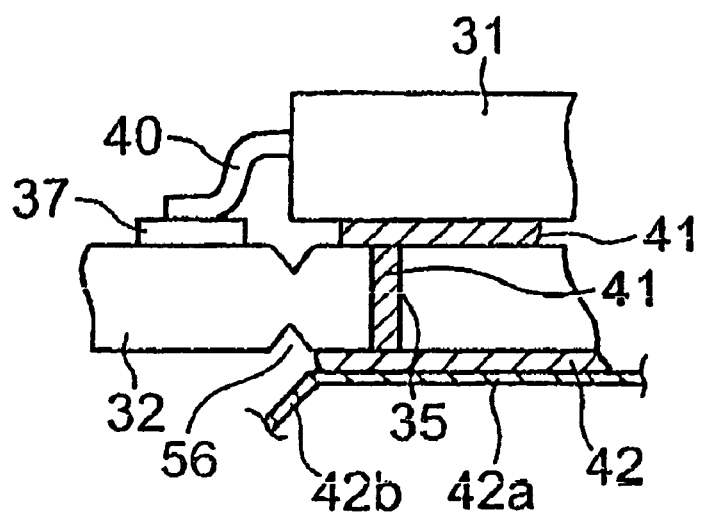
FIG. 12 is a cross sectional diagram of the main portion of an optical transmitter of Embodiment 6 of the present invention.

FIG. 12 is a cross sectional diagram of the main portion of an optical transmitter as an electronic apparatus of Embodiment 6 of the present invention.

A groove 56 is formed between the signal pattern 37 used for the first electronic components 31, and the area where the plurality of through holes 35 are formed in the optical transmitter of Embodiment 6. Further, the grounding pattern 38 is not connected to the through holes 35, differing from Embodiments 4 and 5. Note that a slit may also be used as a substitute for the groove.

The through holes 35 are formed directly under the first electronic components 31 in Embodiment 6 as well, and the level portion 42a of the protruding portion 42 is opposite to the rear surface of the electronic circuit substrate 32. Heat generated from the first electronic components 31 is therefore transmitted to the protruding portion 42 via the through holes 35, and is then emitted to the outside from the case 33, which is made of aluminum having high thermal conductivity and which contacts the atmosphere over a large area. Moreover, the heat dissipating grease 41 with high thermal conductivity fills the inside portions of the through holes 35, and the space between the rear surface of the electronic circuit substrate 32 and the level portion 42a. Heat generated from the first electronic components 31 is therefore transmitted very smoothly to the protruding portion 42, and the heat dissipating efficiency of the first electronic components 31 is raised.

Further, the grounding pattern 38 is not connected to the through holes 35, and therefore heat generated by the first electronic components 31 does not spread out over the entire electronic circuit substrate 32 via the grounding pattern 38. Furthermore, the insulating groove 56 is formed between the signal pattern 37 and the area where the plurality of through holes 35 are formed, and therefore heat generated by the first electronic components 31 is inhibited from spreading out over the entire electronic circuit substrate 32 along the top and rear surfaces of the electronic circuit substrate 32. As a result, thermal stress imparted to other electronic components around the first electronic components can be reduced, and electronic components that are sensitive to temperature change can be mounted in the periphery of the heat generating electronic components, while assuring that heat dissipation from the first electronic components as the heat generating component is performed.

Note that although Embodiment 4 is explained using an optical receiver as an electronic apparatus, other apparatuses can also be applied, for example an optical transmitter, or an optical transceiver in which an optical receiver and an optical transmitter are combined. Further, although Embodiment 5 and Embodiment 6 are explained using an optical transmitter as the electronic apparatus, other apparatuses can also be applied, for example an optical receiver or an optical transceiver.

Furthermore, although BT resin is used as the substrate for the electronic circuit substrate, a glass epoxy resin may also be used.

In Embodiment 5 the space between the electronic circuit substrate 32 and the case 33 as the support member is ensured using the stepped pin, but a substrate on which an electronic component is mounted may also be used as the support member.

Further, although the through holes 35 and the protruding portion 42 of the case 33 as the heat dissipating member are thermally connected in Embodiment 6, a heat dissipating member such as a heat dissipating sheet may also be formed between the case and the electronic circuit substrate, for example, and the heat dissipating sheet may be thermally connected to the through holes.

What is claimed is:

1. An electronic apparatus provided with an electronic circuit substrate comprising:

an electronic circuit substrate mounting a hear generating component, a case for protectively housing said electronic circuit substrate and provided with an opening for housing said electronic circuit substrate, and a cover for blocking said opening of said case wherein, said heat generating component is exposed to the atmosphere in the case, said electronic circuit substrate comprises a resin circuit board formed with a wiring pattern and a grounding pattern in an internal layer thereof, and a plurality of through holes formed directly below a portion where said heat generating component is mounted and connected with said grounding pattern, and said case comprises a heat dissipating protruding surface portion contacting an area where said through holes of a rear surface of said electronic circuit substrate are disposed, and is formed so as to ensure a space between portions of said case other than said protruding surface portion and said rear surface of said electronic circuit substrate for enabling mounting of low heat generating electrical/electronic components to said rear surface of said electronic circuit substrate.

2. An electronic apparatus provided with an electronic circuit substrate according to claim 1 wherein:

a filler of a material with high thermal conductivity is filled in said plurality of through holes, and a heat dissipating grease intervenes at a contact portion between an area where said through holes of said electronic circuit substrate rear surface are disposed and said heat dissipating protruding surface portion of said case.

3. An electronic apparatus provided with an electronic circuit substrate comprising:

an electronic circuit substrate mounting a heat generating component, a case for protectively housing said electronic circuit substrate and provided with an opening for housing said electronic circuit substrate, and a cover for blocking said opening of said case wherein, said electronic circuit substrate comprises a resin circuit board formed with a wiring pattern and a grounding pattern in an internal layer thereof, a plurality of through holes formed directly below a portion where said beat generating component is mounted and which are not connected to said grounding pattern, an insulating groove comprising a concave groove formed in a front surface of said substrate mounting said heat generating component so as to surround said heat generating component, and an insulating groove also comprising a concave groove being formed in a rear surface of said substrate at a location opposite that of said groove in said substrate front surface, said case comprising a heat dissipating protruding surface portion contacting an area where said through holes of said rear surface of said electronic circuit substrate are disposed, and formed so as to ensure a space between portions of said case other than said protruding surface portion and said rear surface of said electronic circuit substrate for enabling mounting of low heat generating electrical/electronic components to said rear surface of said electronic circuit substrate.

4. An electronic apparatus provided with an electronic circuit substrate according to claim 3 wherein:

a filler of material with high thermal conductivity is filled in said plurality of through holes, and a heat dissipating grease intervenes at a contact portion between an area where said through holes of said electronic circuit substrate rear surface are disposed and said heat dissipating protruding surface portion of said case.

5. An electronic apparatus comprising:

an electronic circuit substrate having mounted on a surface thereof a first heat generating electronic component and a case for housing said electronic circuit substrate, wherein said first heat generating electronic component is exposed to the atmosphere in the case;

wherein said electronic circuit substrate has a plurality of through holes disposed directly below said first heat generating electronic component, and thermally connected to said first heat generating electronic component;

said first electronic circuit substrate has a grounding pattern thermally connected to said through holes;

and wherein said case has a protruding portion disposed in contact with a rear surface portion of said electronic circuit substrate directly below said first heat generating electronic component and thermally connected to said through holes.

6. An electronic apparatus according to claim 5, wherein said protruding portion is formed by pressing a portion of said case to the inside.

7. An electronic apparatus according to claim 5, wherein said through holes are filled with a heat dissipating grease.

8. An electronic apparatus according to claim 5, wherein said electronic circuit substrate includes a base material of a BT resin.

\* \* \* \* \*